United States Patent [19]

Klein et al.

[11] Patent Number: 5,023,058
[45] Date of Patent: Jun. 11, 1991

[54] AMPOULE FOR CRYSTAL-GROWING FURNACE

[75] Inventors: John F. Klein, Port Washington, N.Y.; Joel Kearns, Reston, Va.; Jerry Gonen, Jericho, N.Y.

[73] Assignee: Grumman Aerospace Corporation, Bethpage, N.Y.

[21] Appl. No.: 472,232

[22] Filed: Jan. 30, 1990

[51] Int. Cl.$^5$ .............................................. B01D 9/00
[52] U.S. Cl. .................................. 422/248; 422/249; 156/620.76; 156/DIG. 83
[58] Field of Search ............... 156/616.1, 616.2, 616.3, 156/616.4, 616.41, 620.7, 620.76, DIG. 83, DIG. 98; 422/248

[56] References Cited

U.S. PATENT DOCUMENTS

| 3,119,778 | 1/1964 | Hamilton | 156/620.7 |
| 4,264,406 | 4/1981 | Hacskaylo | 156/616.41 |
| 4,666,681 | 5/1987 | Ferrand et al. | 156/DIG. 83 |
| 4,740,264 | 4/1988 | Naumann et al. | 156/620.76 |

FOREIGN PATENT DOCUMENTS

| 0130865 | 1/1985 | European Pat. Off. | 422/248 |
| 0041116 | 10/1978 | Japan | 156/DIG. 98 |

OTHER PUBLICATIONS

"Methods of Growing Crystals Under Pressure"; A. G. Fischer, *Crystal Growth*, 2 ed., Brian R. Pamplin, p. 373 (Fig. 9.19).

Primary Examiner—Olik Chaudhuri
Assistant Examiner—Felisa Garrett
Attorney, Agent, or Firm—Pollock, VandeSande & Priddy

[57] ABSTRACT

An ampoule is designed for inclusion within a multi-zone furnace which forms particularly well in space. The ampoule includes an outer quartz wall which has outward projections supported by complementary members of a space furnace and minimizes the transferral of vibrational forces through the ampoule. An inner quartz containment member includes a hollow projection for holding a semiconductor seed, the containment member extending toward a charge containment section. A tube is positioned between an outward end of the charge and the interior wall of the ampoule for maintaining the charge in place during space travel. Further, the tube serves as a vapor chamber for accommodating overpressurization of a vapor component such as arsenide, in the case a gallium arsenide crystal is being grown. The ability to accommodate overpressurization of the vapor allows a uniform and homogeneous single crystal to be grown.

2 Claims, 1 Drawing Sheet

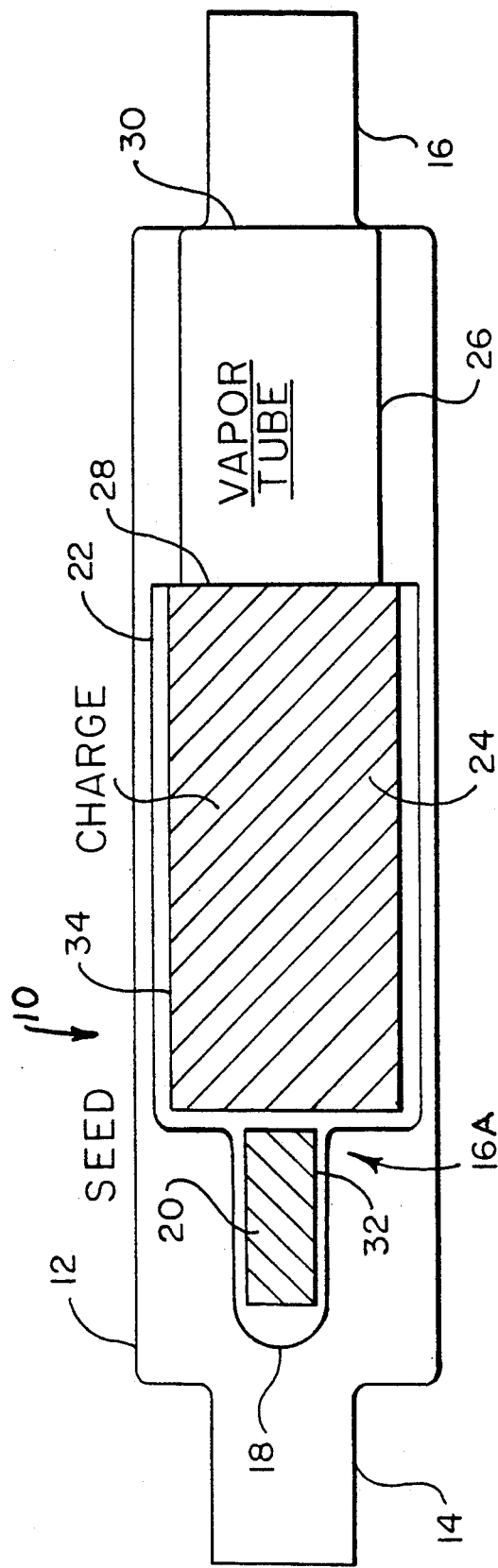

AMPOULE FOR CRYSTAL-GROWING FURNACE

FIELD OF THE INVENTION

The present invention relates to a crystal-growth ampoule for use in a multi-zone furnace, and more particularly to such an ampoule particularly suited for withstanding the stress and vibration of space flight.

BACKGROUND OF THE INVENTION

A gradient-type furnace for growing semiconductor crystals is illustrated in U.S. Pat. No. 4,086,424 which issued Apr. 25, 1978. In this patented furnace a temperature profile having 21 zones is achieved by sequentially powering the heating elements in each zone. An improved furnace is disclosed in U.S. patent application Ser. No. 132,224, filed Dec. 14, 1987, and assigned to the present assigned. Other gradient-type furnaces of the type employed with the present invention are disclosed in U.S. patent applications No. 264,341, filed Oct. 31, 1988; and No. 264,378, filed Oct. 31, 1988.

The process for fabricating a semiconductor crystal, such as gallium arsenide, starts with an ampoule which contains a raw gallium arsenide charge which is not of single crystal composition. A seed of single crystalline structure is positioned within the ampoule and adjacent the ingot. The ampoule containing the charge is then subjected to a sequence of carefully controlled temperature changes which result in the melting and solidification of the charge. The presence of the seed adjacent the charge causes the solidification of the charge as a single crystal structure.

In order to achieve high uniformity and homogeneity of the grown crystal, it is desirable to have the crystal grown in space where it is not subjected to normal gravitational forces. However, due to the excessive vibration during lift-off and re-entry, the seed and charge are often disturbed upon lift-off so that crystal growth is not possible in space or the grown crystal is damaged when encountering vibrational and impact forces upon re-entry and landing.

BRIEF DESCRIPTION OF THE INVENTION

The ampoule of the present invention incorporates structural and functional requirements for use in a crystal-growing space flight furnace. Namely, the ampoule is designed to withstand the structural stresses, vibrations, etc., of launch as well as landing, and must be able to provide for the thermal conditions of growing semiconductor crystals in space.

In a preferred embodiment of the present invention, a 5 mm quartz wall is fabricated to be approximately 18 inches long and about 2 inches in diameter. Within the wall are included a multiple quartz assembly which is used to support a semiconductor ingot. The multiple quartz assembly includes a small diameter projection for supporting the ampoule in a furnace and for minimizing the interface between the ampoule and the furnace thereby minimizing vibration transmission to the ampoule.

The ampoule of the present invention includes a segment for holding a single crystal seed while enclosing a charge of semiconductor material. A quartz tube is positioned within the ampoule wall and bears against the charge so that it is held in place during space flight, launching, and transport, as well as maintaining the grown crystal during the recovery phase of a space flight.

The ampoule of the present invention is also unique in that it provides a large space adjacent the charge which can be used for vapor control, such as an arsenic zone in a gallium arsenide ampoule.

BRIEF DESCRIPTION OF THE FIGURE

The above-mentioned objects and advantages of the present invention will be more clearly understood when considered in conjunction with the accompanying drawing, in which:

The FIGURE is a diagrammatic view of an ampoule in accordance with the present invention which illustrates the disposition of a semiconductor charge and seed therein.

DETAILED DESCRIPTION OF THE INVENTION

Referring to the FIGURE, the ampoule of the present invention is generally indicated by reference numeral 10. It is seen to include an outer wall 12 having end projections 14 and 16 which fit into complementary supports within a furnace. By supporting the ampoule at both ends, as opposed to along the entire length of the ampoule, vibration transfer to the ampoule is minimized. In a preferred embodiment, the ampoule wall is approximately 18 inches long and the thickness of wall 12 is 5 mm.

Within the wall is a containment member 16A. The containment member is likewise fabricated from quartz and includes a hollow projection 18 at one end thereof for holding a semiconductor seed 20 having a single crystal composition. The seed may be composed of gallium arsenide. The containment member 16A extends to a larger cylindrical section 22 which contains the semiconductor charge 24 which, in a preferred embodiment of the invention, is a raw gallium arsenide crystalline material.

A quartz tube 26 is positioned between the right illustrated end 30 of ampoule 10 and the right illustrated end of charge 24. The purpose of the tube is twofold. In the first place, the tube acts as an abutment for maintaining the charge 24 against the left illustrated end 30 of cylindrical section 22. Further, it serves the function of creating a vapor space for vapor during the transformation of the charge between the various phases of crystal growth. The existence of this space allows for the overpressurization within the containment member 16A. Since such overpressurization becomes possible by virtue of the present ampoule design, a final single crystal may be grown having considerable homogeneity and uniformity.

As an additional means for snugly containing the seed 20 within hollow projection 18, the seed 20 may be covered with commercially available BETA cloth 32. Similarly, the charge 24 may be covered with BETA cloth 34 which helps contain the charge within the cylindrical section 22.

The foregoing describes an ampoule design which is capable of withstanding the stresses and vibrational forces of space vehicle launch and recovery. Further, the inclusion of quartz tube 26 creates a vapor space that enables a homogeneous and uniform single crystal to be grown in space.

It should be understood that the invention is not limited to the exact details of construction shown and described herein for obvious modifications will occur to persons skilled in the art.

We claim:

1. An ampoule for growing semiconductor crystals comprising:
    an outer generally cylindrical wall;
    projections formed on outer ends of the wall for securing the ampoule within a furnace;
    a generally cylindrical step down inner container closed at one end and having two contiguous hollow sections including
       (a) a first section of smaller diameter located at the closed cylindrical end for enclosing a single crystal seed; and
       (b) a second section of larger diameter for receiving a charge of raw material through an open end, the charge positioned adjacent the seed;
    a tube located inside the wall, abutting an end of the charge, the tube being located at the open cylindrical end for maintaining the charge in place and creating a space for vapor emitted from the charge thereby accommodating overpressurization of the charge when it is being melted for ensuring uniformity and homogeneity of a grown crystal.

2. An ampoule for growing CaAs semiconductor crystals in a space furnace, comprising:
    an outer generally cylindrical wall;
    projections formed on outer end of the wall for securing the ampoule within a furnace;
    a generally cylindrical step down inner container closed at one end and having two contiguous hollow sections including
       (a) a first section of smaller diameter located at the closed cylindrical end for enclosing a single crystal GaAs; and
       (b) a second section of larger diameter for receiving a charge of raw GaAs through an open end, the charge positioned adjacent the seed;
    a tube located inside the wall, abutting an end of the charge, the tube being located at the open cylindrical end for maintaining the charge in place and creating a space for GaAs vapor emitted form the charge thereby accommodating overpressurization of the charge when it is being melted for ensuring uniformity and homogeneity of a grown GaAs crystal.

* * * * *

UNITED STATES PATENT AND TRADEMARK OFFICE
CERTIFICATE OF CORRECTION

PATENT NO. : 5,023,058
DATED : June 11, 1991
INVENTOR(S) : John Klein, et al.

It is certified that error appears in the above-identified patent and that said Letters Patent is hereby corrected as shown below:

Column 4, line 3, change "CaAs" to --GaAs--.

Column 4, line 6, change "end" to --ends--.

Column 4, line 20, change "form" to --from--.

Signed and Sealed this

Eighth Day of December, 1992

Attest:

DOUGLAS B. COMER

Attesting Officer

Acting Commissioner of Patents and Trademarks